United States Patent [19]

Moore et al.

[11] Patent Number: 4,656,313
[45] Date of Patent: Apr. 7, 1987

[54] EMI/EMP ELECTRICAL CABLE PENETRATION SEAL

[75] Inventors: Rogers A. Moore, Afton; Joseph R. O'Brien, Tulsa; David O. Brown, Claremore, all of Okla.

[73] Assignee: General Signal Corporation, Stamford, Conn.

[21] Appl. No.: 824,293

[22] Filed: Jan. 23, 1986

Related U.S. Application Data

[63] Continuation of Ser. No. 563,188, Dec. 19, 1983, abandoned.

[51] Int. Cl.$^4$ ............................................. H05K 9/00
[52] U.S. Cl. .................................... 174/35 R; 174/48
[58] Field of Search ............... 174/65 R, 65 SS, 35 R, 174/78, 93, 48; 339/143 R, 143 C

[56] References Cited

U.S. PATENT DOCUMENTS 3,322,885  5/1967  May et al. ............................. 174/78
4,291,195  9/1981  Blomqvist et al. ..................... 174/48

FOREIGN PATENT DOCUMENTS 2156608  5/1973  Fed. Rep. of Germany ...... 174/151
2909890  9/1980  Fed. Rep. of Germany .... 174/35 R
2932612  2/1981  Fed. Rep. of Germany ... 174/65 SS Primary Examiner—Arthur T. Grimley
Assistant Examiner—D. A. Tone
Attorney, Agent, or Firm—Robert R. Hubbard; Milton E. Kleinman

[57] ABSTRACT

A method, and apparatus for practicing the method, is provided for the transit of one or more cables through an opening in a bulkhead while preventing electromagnetic interference and electromagnetic pulse energy from passing through the opening. A housing of electrically conductive material is positioned in the opening and secured around its full perimeter in electrically conductive contact with the bulkhead. The sheathing of each cable is treated so that the conductive shield of each cable is exposed. The cables pass through the housing with their exposed shield being within the interior of the housing. The end portions of the housing are sealed, such as by the use of deformable material. Electrically conductive material, such as shot, granules, powder, grease, liquids or the like, is used to fill the interior of the housing to form conductive paths between the shield of each cable and the housing. The material may be in the form of particulates, semi-liquid, or liquid, including conductive coatings.

7 Claims, 3 Drawing Figures

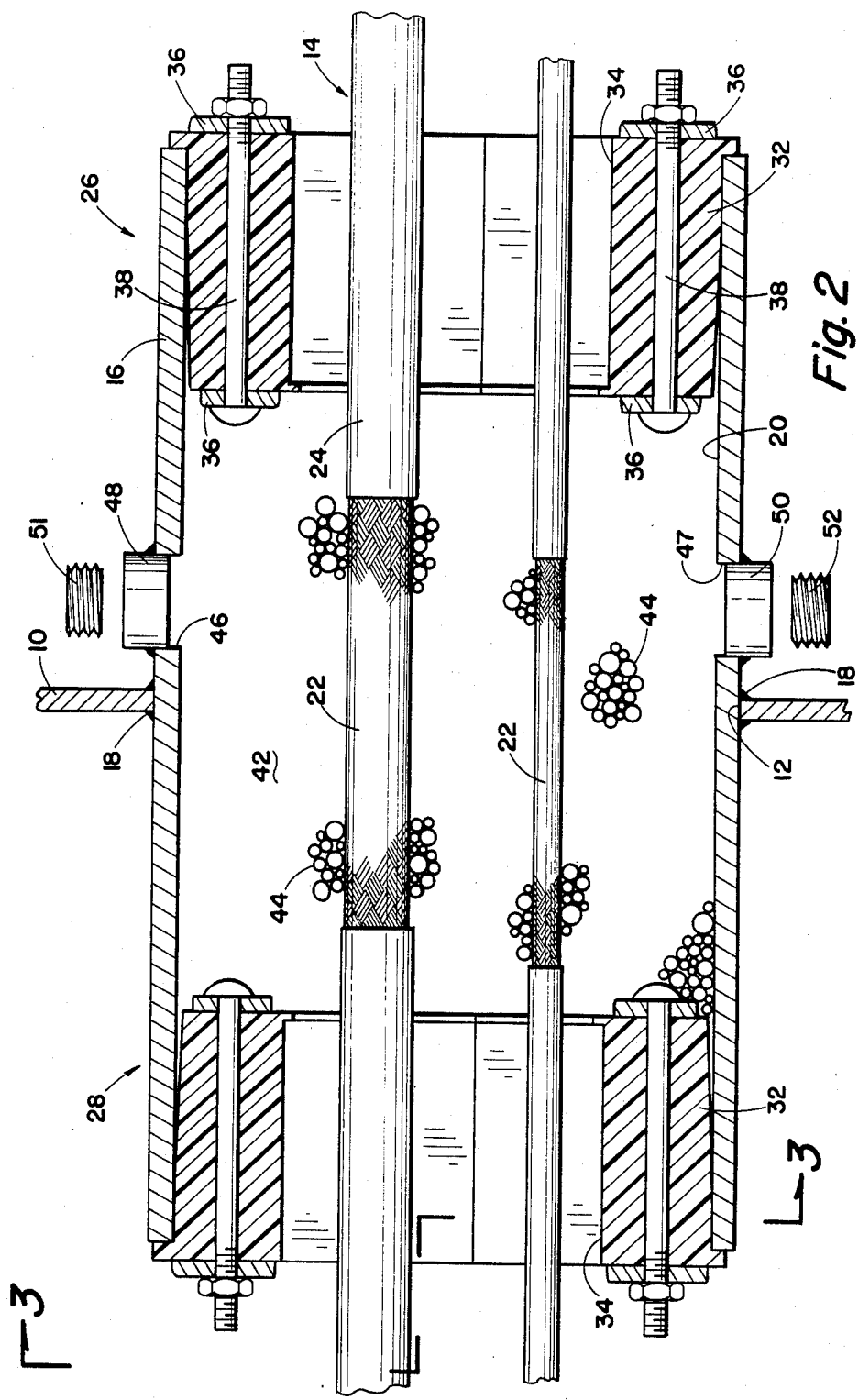

EMI/EMP ELECTRICAL CABLE PENETRATION SEAL

This application is a continuation of Application Ser. No. 563,188 filed Dec. 19, 1983 for EMI/EMP Electrical Cable Penetration Seal, now abandoned.

SUMMARY OF THE INVENTION

This invention is particularly useful in connection with structures including sensitive electronic equipment subject to interference by electromagnetic energy, whether in the form of electromagnetic interference (EMI) or electromagnetic pulses (EMP). Transitional electrical cable deck or wall penetration sealent systems have been devised to prevent the spread of fire, water or gasses between various compartments of a ship or a building. However, EMI and EMP can enter through these traditional multiple cable penetration seals since, among other reasons, the sealing compounds which are used in them are not electrically conductive. Such EMI/EMP energy can interfere with and, in some drastic situations, put electronic equipment completely out of commission.

The EMP phenomenon is of great concern to the military and defense industry. The EMP problem originated with the advent of atomic bombs. Nuclear explosions produce high voltage surges similar to lightening bolts called electromagnetic pulses (EMP) although EMP resembles lightening, there are differences. Lightening is confined to a small area while EMP spreads in all directions. Also, an EMP reaches its peak strength about 100 times faster than lightening. All metal objects will pick up an EMP. If the object is a cable or an antenna hooked up to electronic equipment the pulses can severely damage the machinery to which these devices are connected. It has been estimated that the EMP from a 1-megaton nuclear blast over the central part of the United States could damage or cripple the nation's communication and power distribution network.

The problem of shielding against EMI/EMP is particularly difficult in connection with the passage of cables through a bulkhead. The expression "bulkhead" as used herein means a wall or a partition in a ship or building or the housing of a piece of equipment, that is, any passageway which extends from an exposed area to an environment which must be protected against EMI/EMP. Cables which carry power and signals can be shielded against EMI/EMP by providing, as a part of the sheathing, an electrically conductive shield. This shield is usually in the form of a braid of metallic material which surrounds and forms one layer in the total sheathing of the cable. However, to prevent this conductive layer from becoming damaged the typical conductor includes an external insulating material. When cables are passed through an opening it is possible for EMI/EMP energy to pass along the exterior of the cable and thereby be transmitted through an opening in a bulkhead which receives the cables.

The present invention is directed towards a system, method and apparatus for providing means for passing cables through an opening in a bulkhead while substantially retarding or eliminating the possibility the passage of EMI/EMP energy through the opening.

A housing is employed of a configuration to receive the cables therethrough. The particular shape of the housing is not critical to the invention; that is, it may be of square, rectangular, or circular cross-sectional configuration. The housing is positioned within the opening in the bulkhead and electrically secured to the opening such as by welding the complete exterior peripherial surface of the housing to the bulkhead.

Before inserting the cables into the housing passageway small lengths of the cables are prepared by removing insulating external sheathing to expose the cable shielding layer. Cables are then extended through the housing passageway in position so that the exposed sheathing remains within the housing.

The end portions of the housing are then sealed. This can be accomplished employing known techniques, such as utilizing a plurality of shaped packing blocks formed of deformable material. The packing blocks are fitted in both ends of the housing to surround the cables and to close the ends of the housing. These shaped blocks are then squeezed to radially expand them to seal against the housing and against the cables.

With the seals in place a cavity is defined within the housing which receives the cables therethrough and particularly the portions of the cables having exposed shielding. The housing has an opening in the sidewall thereof communicating with this interior cavity. The cavity is filled with electrically conductive material which may be in the form of shots, granules, powder, grease, liquid, or the like. The conductive material may be formed of metal, such as lead, steel, copper, or alloys. One type of conductive material which functions satisfactorily is that formed of small particles of plastic covered with a conductive coating. The use of conductive plastic pellets is preferred because of their light weight if the apparatus is used in an environment, such as on an aircraft, where weight becomes an important factor.

The conductive material fills the interior of the cavity and provides electrical paths between the shielding of each cable and the housing which in turn is electrically connected with the bulkhead so that the shielding of the cables is grounded to the bulkhead. In addition, the conductive matter fully encloses the interior of the cavity to thereby shield against the passage of EMI/EMP energy therethrough.

An advantage of the system of this invention is that it readily facilitates the removal of the cables, or the placement of addition cables. This can be accomplished since the conductive matter can be removed from the interior of the housing and the seals removed.

By the principles of this invention a safe, dependable, economical and highly adaptive method, is provided which can accommodate a great variety of different sizes, shapes and combination of sizes and shapes of conductors. The apparatus can be installed and utilized without the necessity of employing skilled labor.

DESCRIPTION OF THE DRAWINGS

FIG. 2 is an elevational cross-sectional view of a device which embodies the system and methods of the present invention showing the passage of cables through an opening in the bulkhead with the device used to seal against the passage of EMI/EMP energy through the opening.

DESCRIPTION OF THE PREFERRED EMBODIMENT

Figure 1:
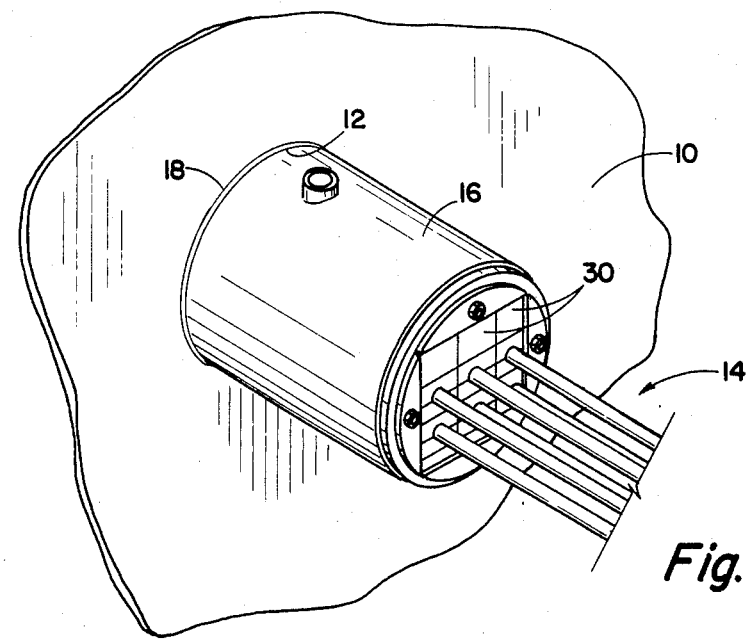
FIG. 1 is an isometric view of a portion of an EMI/EMP electrical cable penetration seal of this invention extending through a bulkhead, such as the invention would be employed passing cables through a metal bulkhead of a ship or an instrument housing.
Figure 3:
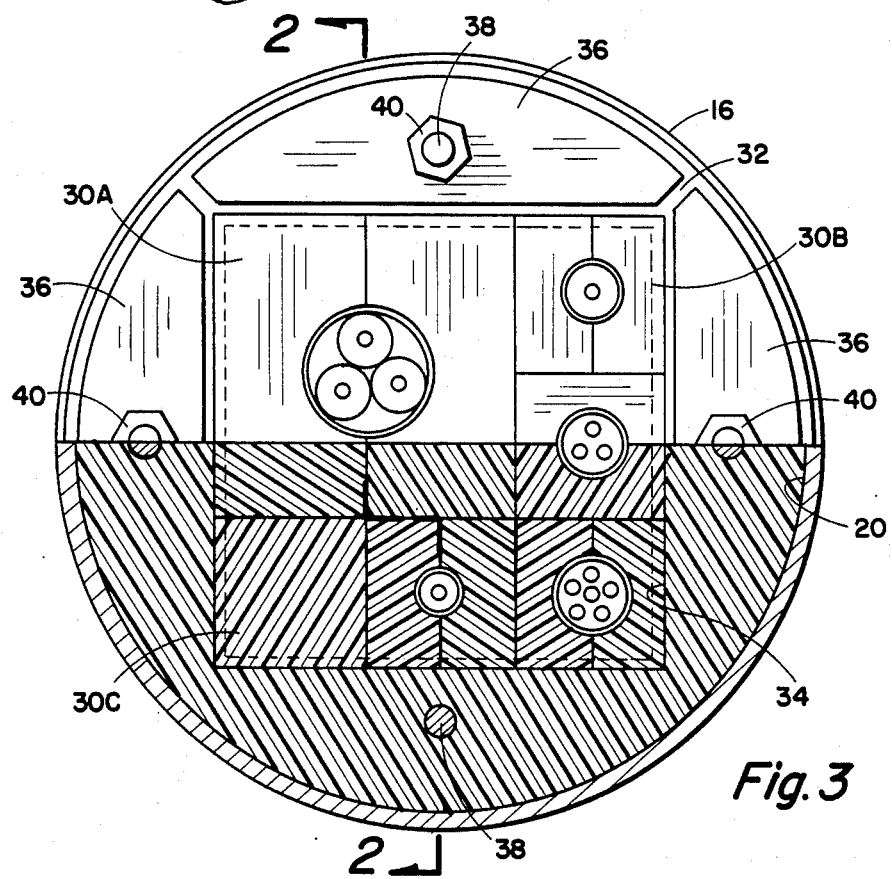
FIG. 3 is a cross-sectional view taken along the lines 3—3 of FIG. 1. The cable arrangement of FIG. 1 is different from that of FIGS. 2 and 3 to illustrate that various combination of sizes and numbers of cables may be employed in practicing the principle of the invention.

Referring to FIGS. 1, 2 and 3 an embodiment of the invention is illustrated, it being understood that the actual apparatus which is illustrated and which will be described is merely exemplary of the invention.

The numeral 10 identifies a bulkhead which, in the illustrated arrangement, is a metal plate which may form the wall or bulkhead of a ship or building, or the housing of instrumentation. In some instances the bulkhead or wall may include other structural members and can include insulation, decorative material or the like. The bulkhead 10 is illustrative of the application of the invention in that it serves to define a protected environment such that on one side of the bulkhead instrumentation is housed which is sensitive to the effect of EMI/EMP energy. Formed in the bulkhead 10 is an opening 12 through which a plurality of cables, generally indicated by the numeral 14, must pass.

The apparatus used to provide the penetration seal includes a housing 16. The cross-sectional configuration of the housing 16 may vary. The cylindrical housing 16 is merely illustrative and it can be seen that it can equally as well be rectangular, square or the like. Opening 12 should conform to the housing 16. Housing 16 is electrically secured to the bulkhead such as by welding 18 around the full external perimeter to seal against the passage of EMI/EMP energy through opening 12 externally of the housing.

Housing 16 includes a passageway 20 therethrough. Since the illustrated housing 16 is in the form of a length of tubular material the passageway 20 is the tubular interior.

Before the cables 14 are extended through the passageway 20 they are carefully prepared as illustrated in FIG. 2. Most cables which carry energy or signals in sensitive environments include a sheathing arrangement which has an electrically conductive shield 22 surrounding the current carrying conductors. Surrounding the electrical shield 22 is an insulating shield 24 usually made of plastic, rubber or the like. Before the cables 14 are extended within passageway 20 portions of the insulating shield 24 are removed to expose short lengths of the electric shield 22.

With the cables so prepared and in position within the housing passageway 20 the next step in the practice of the invention is to seal the end portions of housing 16. This can be accomplished in a variety of ways such as by sealing the end portions with rubber molds, putty, foam, concrete, epoxy or the like. The only requirement is that seals generally indicated by the numerals 26 are formed within the opposed ends of the housing. In the illustrated arrangement the seals are of the form utilizing shaped blocks of deformable material. This type of sealing arrangement is well known in the industry and it is exemplified by a sealing system manufactured and sold by Nelson Electric Co. a unit of General Signal, Post Office Box 726, Tulsa, Okla. 74101, and identified as the "Nelson Multi-Cabled Transit (MCT) Product". Generally, this successful sealing system employs a plurality of blocks of compressible material, the blocks being available in a large number of external dimensional standards and with different size grooves to receive cables therebetween of varying diameters. In the isometric view of FIG. 1 the end view of a plurality of deformable blocks 30 are shown. FIG. 3 shows deformable blocks 30A, 30B, 30C in varying cross-sectional arrangements and of varying external cross-sectional dimensions configured to be assembled within a confined area to accept varying sizes of cables. An insert 32 having an external cross-sectional configuration conforming to the passageway 20 is inserted into each end of the housing, the insert 32 providing a square passageway 34. The blocks 30A, 30B, 30C and so forth are inserted into the square passageway 34. By means of metal plates 36 and bolts 38 which receive nuts 40 the large insert 32 can be squeezed, thereby compressing the formed blocks 30A, 30B, 30C etc. The material of which the insert 32 and the blocks 30 are formed is preferably of the type which resists the spread of fire, however, since such materials must be deformable they are not readily made electrically conductive and therefore do not resist EMI/EMP energy passage.

With the seals 26 and 28 in place a cavity 42 is formed in the interior of housing 16 which receives the passage of cables 14 therethrough. The exposed electrical shields 22 of each of the cables is within cavity 42.

To complete the transit of the cables through the opening 18 in a manner to retard the passage of EMI/EMP energy, electrically conductive material 44 is then used to fill cavity 42. For this purpose, a first small opening 46 is formed in the housing 16. This may be closed by a short internally threaded nipple 48 which is closed by a plug 51. In a preferred practice of the invention a second opening 47 with a second nipple 50 and plug 52 are also employed. The openings 46 and 47 are preferably spaced opposite each other and in the most preferred embodiment are arranged so that the first opening 46 is on top and the second opening 47 on the bottom. The bottom plug 52 is normally retained in the nipple 50 closing the bottom opening. The conductive material 44 may then be inserted into the cavity 42 through the nipple 48 to completely fill the cavity.

The conductive material 44 is a most important aspect of the invention. It may be in the form of shots, granules, powder, grease, liquid or a combination of these. In other words, the conductive material can be of any shape and the size is critical only in that it must be small enough to readily be deposited within cavity 42 and to fill the cavity leaving a minimum of void area. The conductive material 42 must contact the electrical shields 22 of each of the cables and must provide an electrical path from the shield of each cable to housing 14. In the preferred practice of the invention the resistance of this electrical path should not exceed two ohms. In some instances a higher resistance can be tolerated and in other instances an even lower resistance may be desirable.

The conductive material may be formed of metal such as lead, steel, copper and any other conductive metal or alloy. The particulate matter should preferably be of a material which does not readily develop surface resistance due to environmental action.

In some applications of the invention weight can become an important factor. In this case, the use of heavy conductive material like lead shot would not be desireable. When weight is a factor a type of conductive material which functions satisfactorily is that formed of plastic particles, such as plastic small diameter balls, covered with a conductive material. Polymer pellets can be treated with chlorine gas for a sufficient time to render the surface of the pellets receptive to metallic coatings. Such metallic coatings may be accomplished in electroless techniques which are well known in industry.

One important advantage of the invention is that the system is readily adapted to the removal or addition of conductors 14. This can be accomplished by first removing the conductive material 44 such as by removing the bottom plug 52. The conductive material (or at least a major portion) will flow out of the opening and can be easily captured for reuse. Next the seals 26 and 28 are removed or, at least decompressed so as to permit removal and insertion of different formed blocks 30. After the new conductor arrangement in place the seals 26 and 28 can be reestablished and the cavity 42 again filled with conductive material. All of this can be accomplished without the requirement of skilled workmen and with a minimum of time and expense.

The invention provides an inexpensive easy to use and highly effective means of affording the penetration of cables through an opening in a bulkhead while at the same time providing EMI/EMP protection.

While the invention has been described with a certain degree of particularity it is manifest that many changes may be made in the details of construction and the arrangement of components without departing from the spirit and scope of this disclosure. It is understood that the invention is not limited to the embodiment set forth herein for purposes of exemplification, but is to be limited only by the scope of the attached claim or claims, including the full range of equivalency to which each element thereof is entitled.

What is claimed is:

1. For use in providing transit of a cable or cables through an opening in a bulkhead, each of the cables having sheathing including an electrically conductive shield which is exposed at least in the area where the cable passes through the bulkhead, the bulkhead including an electrically conductive shield for the environment encompassed by the bulkhead, a system for retarding the transmission of electromagnetic interferences (EMI) and electromagnetic pulses (EMP) through the opening comprising:

an integral housing of uniform internal cross-sectional configuration and of conductive material receivable in the opening in a bulkhead, the housing having a cable receiving passageway therethrough;

means for electrically engaging said housing with a bulkhead electrically conductive shield around the full external perimeter of said housing;

means of removably and sealably closing each end of said cable receiving passageway providing a cavity area within said housing passageway intermediate the closed ends providing means for receiving at least one shielded cable therethrough having at least a portion of its conductive shield exposed to the interior of the cavity area;

electrically conductive material selected from the group consisting of electrically conductive powder, granules, pellets, grease, liquid or a mixture thereof; and said electrically conductive material filling said housing cavity area and electrically communicating the conductive shield of each cable received therein with said housing wherein said housing has at least one opening therethrough intersecting said passageway providing means for depositing said electrically conductive material therein.

2. The system of retarding the transmission of EMI/EMP energy through a cable passage in a bulkhead according to claim 1 wherein said housing has a second opening therethrough intersecting said passageway, said second opening being spaced from and gravitationally oriented oppositely of said at least one mentioned opening providing means of removing said electrically conductive material from said housing.

3. The system for retarding the transmission of EMI/EMP energy through a cable passage in a bulkhead of claim 1 wherein said bulkhead is formed, at least in part, by said bulkhead shield being a metal plate, and wherein said means of electrically engaging said housing with said bulkhead includes mechanically attaching said housing to the metal plate.

4. The system for retarding the transmission of EMI/EMP energy through a cable passage in a bulkhead of claim 1 wherein at least one of said means of removably and sealably closing each end of said cable receiving passageways includes:

a plurality of shaped packing blocks of deformable material surrounding the cable and filling the end portion of said passageway; and means to compress said packing blocks to radially expand them against the interior of the passageway end portion and against cables received in said passageway.

5. The system for retarding the transmission of EMI/EMP energy through a cable passageway in a bulkhead according to claim 4 wherein said shaped packing blocks are formed of fire retardant material.

6. The system for retarding the transmission of EMI/EMP energy through a cable passageway in a bulkhead according to claim 1 wherein at least one of the members of said group is formed of an electrically particulate material.

7. The system for retarding the transmission of EMI/EMP energy through a cable passageway in a bulkhead according to claim 1 wherein at least one of the members of said group is formed of plastic material having an electrically conductive coating thereon.

* * * * *